US010930839B2

(12) United States Patent
Chu et al.

(10) Patent No.: US 10,930,839 B2
(45) Date of Patent: Feb. 23, 2021

(54) MAGNETORESISTIVE RANDOM ACCESS MEMORY HAVING A RING OF MAGNETIC TUNNELING JUNCTION REGION SURROUNDING AN ARRAY REGION

(71) Applicant: UNITED MICROELECTRONICS CORP., Hsin-Chu (TW)

(72) Inventors: Chung-Liang Chu, Kaohsiung (TW); Jian-Cheng Chen, New Taipei (TW); Yu-Ping Wang, Hsinchu (TW); Yu-Ruei Chen, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/739,060

(22) Filed: Jan. 9, 2020

(65) Prior Publication Data

US 2020/0144485 A1    May 7, 2020

Related U.S. Application Data

(63) Continuation-in-part of application No. 16/029,641, filed on Jul. 8, 2018, now Pat. No. 10,566,520.

(30) Foreign Application Priority Data

Jun. 8, 2018    (CN) .......................... 201810586453.5

(51) Int. Cl.
*H01L 27/22* (2006.01)
*H01L 43/02* (2006.01)
*H01L 43/10* (2006.01)

(52) U.S. Cl.
CPC ............ *H01L 43/02* (2013.01); *H01L 27/222* (2013.01); *H01L 43/10* (2013.01)

(58) Field of Classification Search
CPC ....... H01L 27/20; H01L 27/222; H01L 41/00; H01L 41/06; H01L 41/12; H01L 41/20
See application file for complete search history.

(56) References Cited

U.S. PATENT DOCUMENTS

8,614,912 B2    12/2013    Lee et al.
2013/0171742 A1    7/2013    Wang
2017/0170386 A1*    6/2017    Chuang ................... H01L 43/02

FOREIGN PATENT DOCUMENTS

WO    2016/200510    12/2016

* cited by examiner

*Primary Examiner* — Hoai V Pham
(74) *Attorney, Agent, or Firm* — Winston Hsu

(57) ABSTRACT

A semiconductor device includes a substrate having an array region defined thereon, a ring of magnetic tunneling junction (MTJ) region surrounding the array region, a gap between the array region and the ring of MTJ region, and metal interconnect patterns overlapping part of the ring of MTJ region. Preferably, the ring of MTJ region comprises an octagon and the ring of MTJ region includes a first MTJ region and a second MTJ region extending along a first direction, a third MTJ region and a fourth MTJ region extending along a second direction, a fifth MTJ region and a sixth MTJ region extending along a third direction, and a seventh MTJ region and an eighth MTJ region extending along a fourth direction.

20 Claims, 6 Drawing Sheets

MAGNETORESISTIVE RANDOM ACCESS MEMORY HAVING A RING OF MAGNETIC TUNNELING JUNCTION REGION SURROUNDING AN ARRAY REGION

CROSS REFERENCE TO RELATED APPLICATIONS

This application is a continuation-in-part of U.S. application Ser. No. 16/029,641, filed Jul. 8, 2018, and which is included herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate having an array region defined thereon, a ring of magnetic tunneling junction (MTJ) region surrounding the array region, a gap between the array region and the ring of MTJ region, and metal interconnect patterns overlapping part of the ring of MTJ region. Preferably, the ring of MTJ region further includes a first MTJ region and a second MTJ region extending along a first direction and a third MTJ region and a fourth MTJ region extending along a second direction.

According to another aspect of the present invention, a semiconductor device includes: a substrate having an array region defined thereon; a first ring of magnetic tunneling junction (MTJ) region surrounding the array region; a second ring of MTJ region surrounding the first ring of MTJ region; a third ring of MTJ region surrounding the second ring of MTJ region; a first gap between the array region and the first ring of MTJ region; a second gap between the first ring of MTJ region and the second ring of MTJ region; and a third gap between the second ring of MTJ region and the third ring of MTJ region.

According to yet another aspect of the present invention, a semiconductor device includes a substrate having an array region defined thereon, a ring of magnetic tunneling junction (MTJ) region surrounding the array region, a gap between the array region and the ring of MTJ region, and metal interconnect patterns overlapping part of the ring of MTJ region. Preferably, the ring of MTJ region comprises an octagon and the ring of MTJ region includes a first MTJ region and a second MTJ region extending along a first direction, a third MTJ region and a fourth MTJ region extending along a second direction, a fifth MTJ region and a sixth MTJ region extending along a third direction, and a seventh MTJ region and an eighth MTJ region extending along a fourth direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
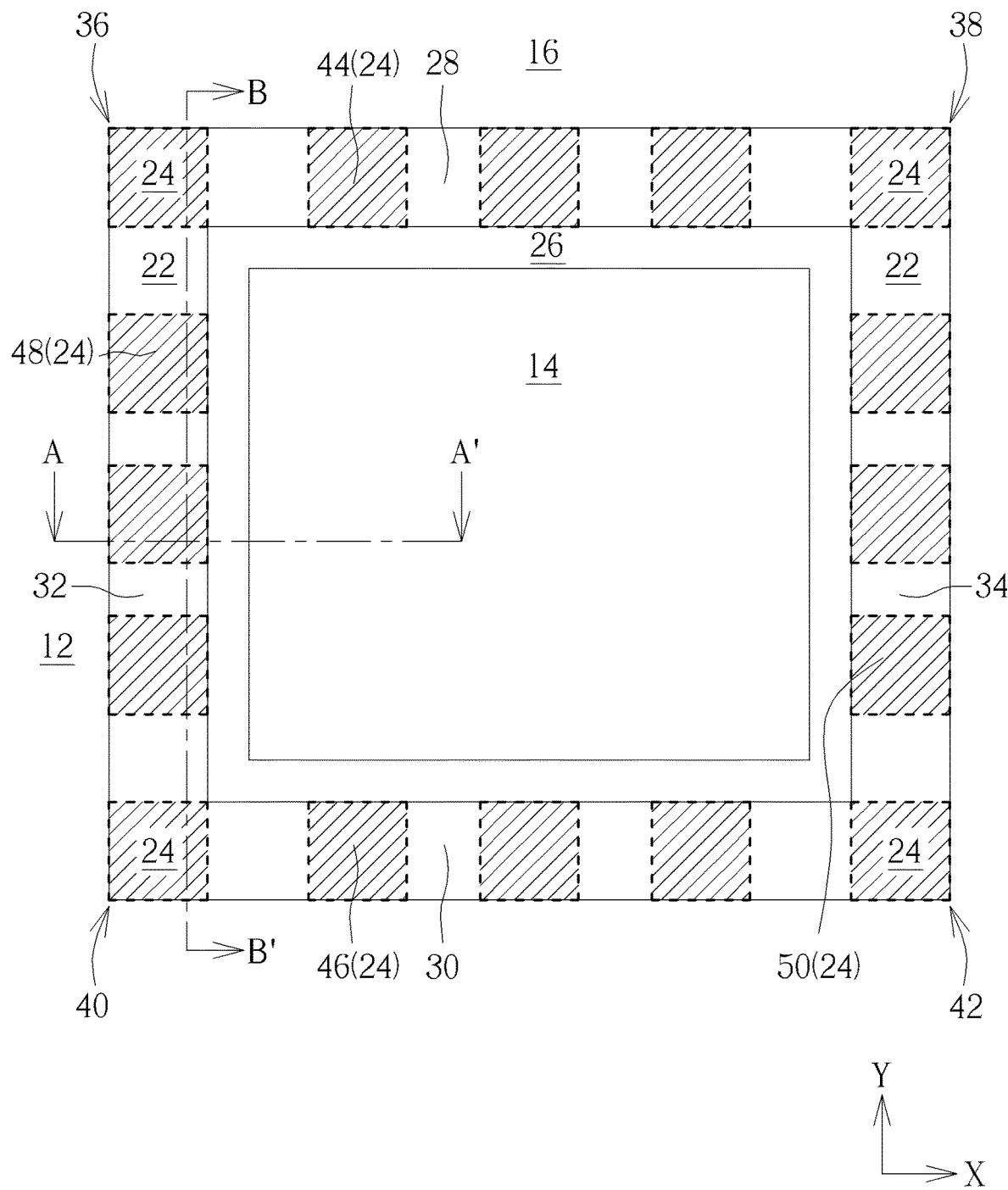
FIG. 1 illustrates a top view of a MRAM device according to an embodiment of the present invention.
Figure 2:
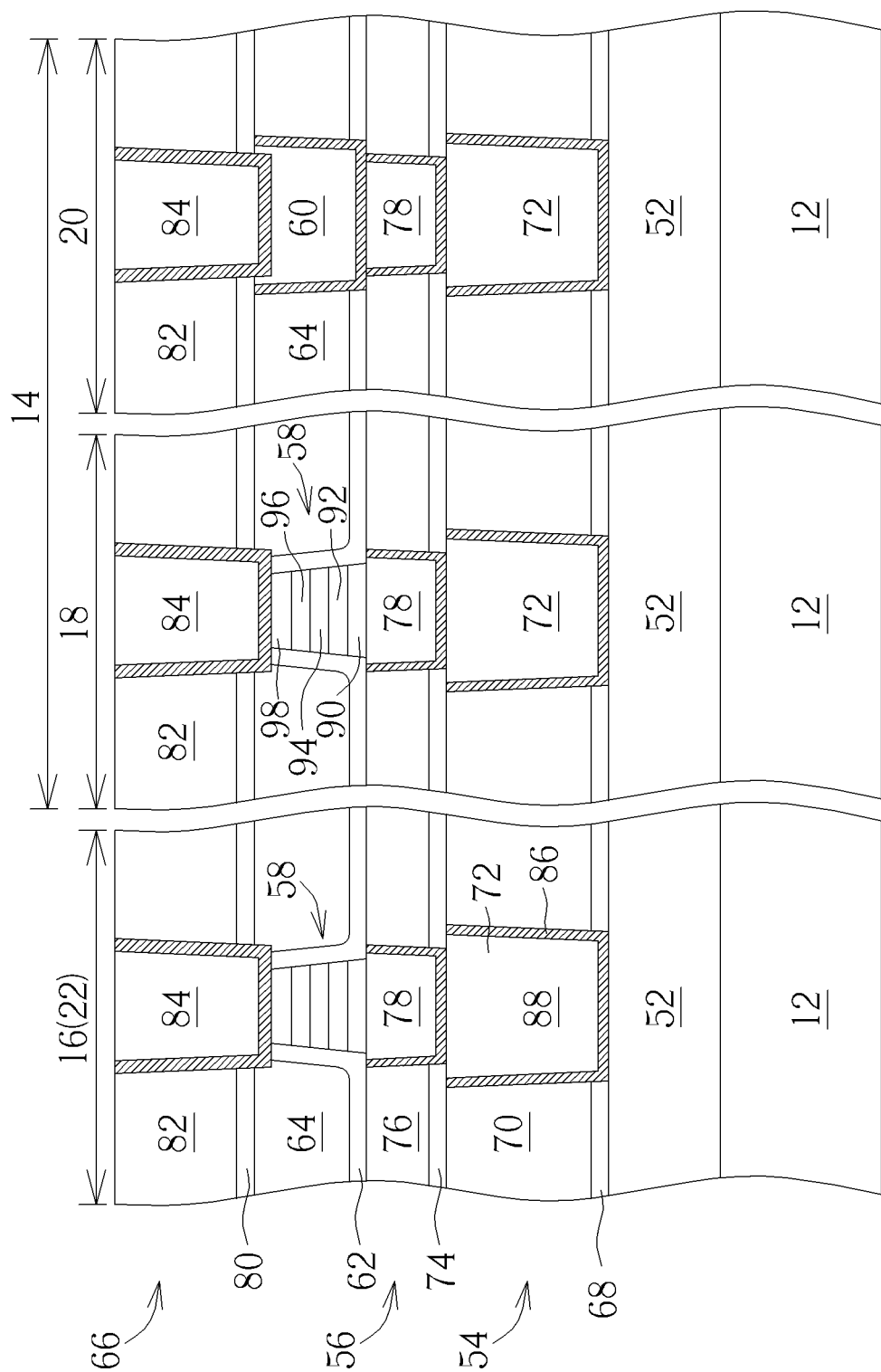
FIG. 2 illustrates a cross-section of the MRAM device along the sectional line AA' of FIG. 1.
Figure 3:
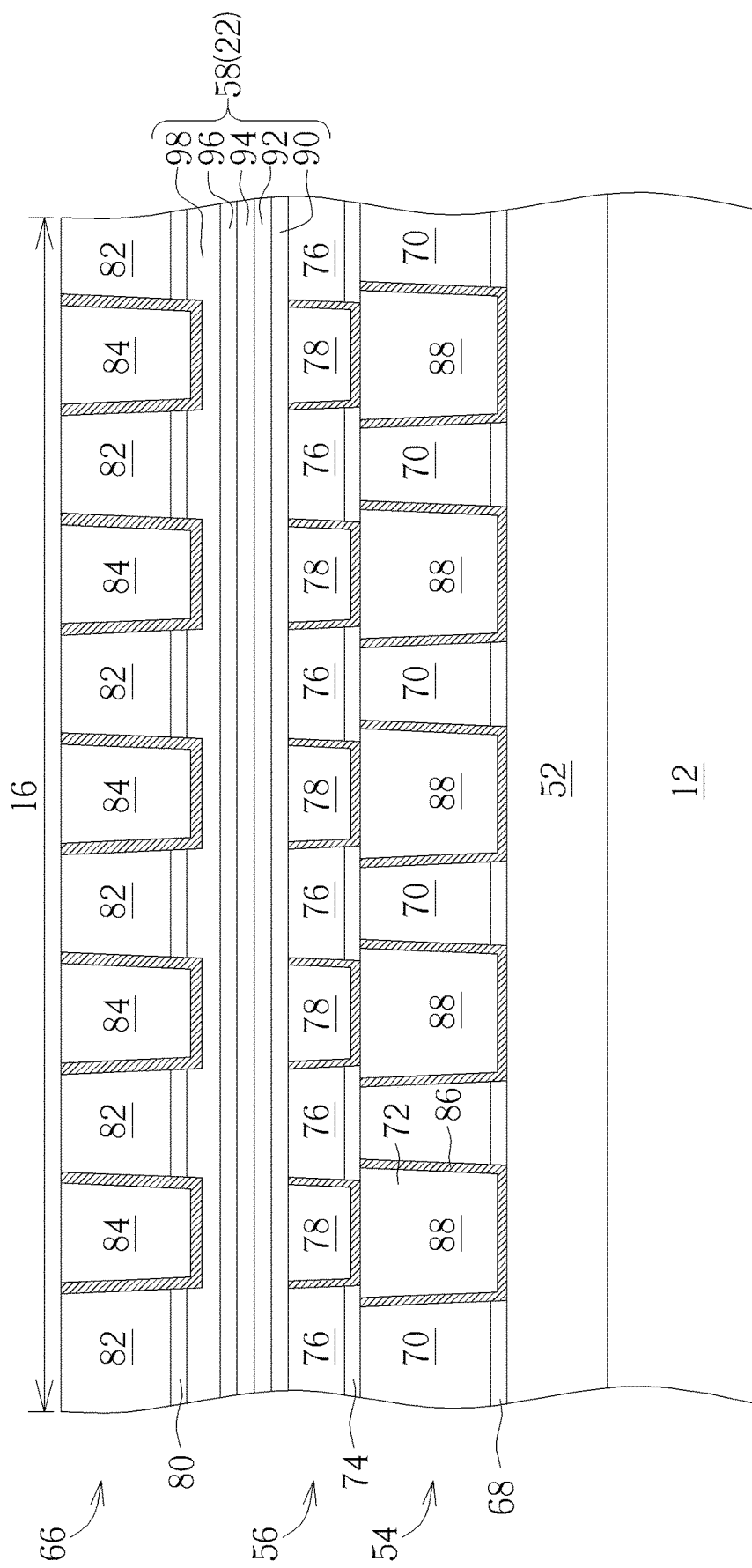
FIG. 3 illustrates a cross-section of the MRAM device along the sectional line BB' of FIG. 1.

Referring to FIGS. 1-3, FIG. 1 illustrates a top view of a semiconductor device, or more specifically a MRAM device according to an embodiment of the present invention, FIG. 2 illustrates a cross-section of the MRAM device along the sectional line AA' of FIG. 1, and FIG. 3 illustrates a cross-section of the MRAM device along the sectional line BB' of FIG. 1. As shown in FIGS. 1-3, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a periphery region 16 surrounding the array region 14 are defined on the substrate 12, in which the array region 14 in this embodiment could also be referred to as a MRAM macro region. The array region 14 could further include a MRAM region 18 and a logic region 20 while the periphery region 16 could include at least a ring of MTJ region 22 surrounding the array region 14.

Viewing from a more detailed perspective, the MRAM unit shown in FIG. 1 also includes a plurality of metal interconnect patterns 24 overlapping part of the MTJ region 22 and a gap 26 disposed between the array region 14 and the ring of MTJ region 22 so that the ring of MTJ region 22 does not contact the array region 14 directly. In this embodiment, the MTJ region 22 surrounding the array region 14 further includes a first MTJ region 28 and a second MTJ region 30 extending along a first direction (such as X-direction) and a third MTJ region 32 and a fourth MTJ region 34 extending along a second direction (such as Y-direction), in which the first MTJ region 28 overlaps the third MTJ region 32 at a first corner 36, the first MTJ region 28 overlaps the fourth MTJ region 34 at a second corner 38, the second MTJ region 30 overlaps the third MTJ region 32 at a third corner 40, and the second MTJ region 30 overlaps the fourth MTJ region 34 at a fourth corner 42.

In other words, the first MTJ region 28, the second MTJ region 30, the third MTJ region 32, and the fourth MTJ region 34 together constitute a square-shaped or rectangular-shaped ring surrounding the array region 14 and the metal interconnect patterns 24 overlap each of the first MTJ region 28, the second MTJ region 30, the third MTJ region 32, and the fourth MTJ region 34, including the metal interconnect patterns 44 overlap the first MTJ region 28, the metal interconnect patterns 46 overlap the second MTJ region 30, the metal interconnect patterns 48 overlap the third MTJ region 32, and the metal interconnect patterns 50 overlap the fourth MTJ region 34.

In this embodiment, each of the metal interconnect patterns 24 includes a square or rectangle and the metal interconnect patterns 24 not only overlap the first MTJ region 28, the second MTJ region 30, the third MTJ region 32, and the fourth MTJ region 34 surrounding the array region 14 but also overlap the four corners including the first corner 36, the second corner 38, the third corner 40, and the fourth corner 42. It should be noted that despite only three metal interconnect patterns 24 are shown to overlap each of the first MTJ region 28, the second MTJ region 30, the third MTJ region 32, and the fourth MTJ region 34, according to an embodiment of the present invention, it would also be desirable to adjust the number of the metal interconnect patterns 24 overlapping the MTJ regions 28, 30, 32, 34. For instance, it would be desirable to dispose only one or more than one metal interconnect patterns 24 on each of the first MTJ region 28, the second MTJ region 30, the third MTJ region 32, and the fourth MTJ region 34, which are all within the scope of the present invention.

Moreover, it should be noted that even though each of the metal interconnect patterns 24 in this embodiment preferably share equal size such as equal lengths and equal widths, according to an embodiment of the present invention, it would also be desirable to adjust the sizes of the metal interconnect patterns 24 so that the metal interconnect patterns 24 could have different lengths and/or different widths. For instance, the metal interconnect patterns 24 overlapping the four corners could include a first size and the metal interconnect patters 44, 46, 48, 50 overlapping the first MTJ region 28, the second MTJ region 30, the third MTJ region 32, and the fourth MTJ region 34 could include a second size that is different from the first size, in which the definition of different size in this embodiment could refer to same lengths and different widths or same widths and different lengths, which are all within the scope of the present invention.

According to yet another embodiment of the present invention, the metal interconnect patterns 24 could also be disposed to only overlap the first MTJ region 28, the second MTJ region 30, the third MTJ region 32, and the fourth MTJ region 34 enclosing the array region 14 but not overlapping the four corners including the first corner 36, the second corner 38, the third corner 40, and the fourth corner 42, which is also within the scope of the present invention.

As shown in the cross-section views in FIGS. 2-3, active devices such as metal-oxide semiconductor (MOS) transistors, passive devices, conductive layers, and interlayer dielectric (ILD) layer 52 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacers, epitaxial layers, and contact etch stop layer (CESL). The ILD layer 52 could be formed on the substrate 12 to cover the MOS transistors, and a plurality of contact plugs (not shown) could be formed in the ILD layer 52 to electrically connect to the gate structure and/or source/drain region of MOS transistors. Since the fabrication of planar or non-planar transistors and ILD layer is well known to those skilled in the art, the details of which are not explained herein for the sake of brevity.

The semiconductor device also includes metal interconnect structures 54, 56 disposed on the ILD layer 52, MTJs 58 disposed on metal interconnect structure 56 on the periphery region 16 and the MRAM region 18, metal interconnection 60 disposed on the metal interconnect structure 56 on the logic region 20, cap layer 62 disposed on sidewalls of the MTJs 58, inter-metal dielectric (IMD) layer 64 disposed around the cap layer 62, and another metal interconnect structure 66 disposed on the MTJs 58 and the metal interconnection 60.

In this embodiment, the metal interconnect structure 54 includes a stop layer 68, an IMD layer 70, and a plurality of metal interconnections 72 embedded within the stop layer 68 and the IMD layer 70, the metal interconnect structure 56 includes a stop layer 74, an IMD layer 76, and a plurality of metal interconnections 78 embedded in the stop layer 74 and the IMD layer 76, and the metal interconnect structure 66 includes a stop layer 80, an IMD layer 82, and metal interconnections 84 embedded in the stop layer 80 and the IMD layer 82.

In this embodiment, each of the metal interconnections 72, 78, 84 within the metal interconnect structures 54, 56, 66 and the metal interconnection 60 could be fabricated according to a single damascene or dual damascene process. For instance, each of the metal interconnections 72 preferably include a trench conductor, each of the metal interconnections 78 preferably include a via conductor, each of the metal interconnections 84 preferably include a via conductor, and the metal interconnection 60 preferably includes a trench conductor.

Moreover, each of the metal interconnections 72, 78, 84 could further includes a barrier layer 86 and a metal layer 88, in which the barrier layer 86 could be selected from the group consisting of titanium (Ti), titanium nitride (TiN), tantalum (Ta), and tantalum nitride (TaN) and the metal layer 88 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 88 are preferably made of copper, the IMD layers 70, 76, 82 are preferably made of silicon oxide, and the stop layers 68, 74, 80 are preferably made of nitrogen doped carbide (NDC), silicon nitride, silicon carbon nitride (SiCN), or combination thereof.

In this embodiment, the formation of the MTJs 58 could be accomplished by sequentially forming a first electrode layer 90, a fixed layer 92, a free layer 94, a capping layer 96, and a second electrode layer 98 on the IMD layer 76. In this embodiment, the first electrode layer 90 and the second electrode layer 98 are preferably made of conductive material including but not limited to for example Ta, Pt, Cu, Au, Al, or combination thereof. The fixed layer 92 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 92 is formed to fix or limit the direction of magnetic moment of adjacent layers. The free layer 94 could be made of ferromagnetic material including but not limited to for example iron, cobalt, nickel, or alloys thereof such as cobalt-iron-boron (CoFeB), in which the magnetized direction of the free layer 94 could be altered freely depending on the influence of outside magnetic field. The capping layer 96 could be made of insulating material including but not limited to for example oxides such as aluminum oxide ($AlO_x$) or magnesium oxide (MgO).

Next, a pattern transfer or photo-etching process is conducted by using a patterned resist (not shown) as mask to remove part of the second electrode layer 98, part of the capping layer 96, part of the free layer 94, part of the fixed layer 92, and part of the first electrode layer 90 to form MTJs 58 on the periphery region 16 and the MRAM region 18, in which each of the MTJs 58 electrically connect or more specifically directly contact the metal interconnections 78 underneath.

It should be noted that even though the bottom surfaces of the MTJs 58 on the periphery region 16 and the MRAM region 18 all contact the metal interconnections 78 directly, only the MTJs 58 on the MRAM region 18 would connect to active devices such as MOS transistors disposed on the surface of the substrate 12. In other words, the metal interconnection 78 or metal interconnection 72 connected to the MTJ 58 on the MRAM region 18 are further connected to MOS transistors on the surface of the substrate 12 while the metal interconnections 72, 78 connected to the MTJ 58 on the periphery region 16 function as dummy metal interconnections are not connected to other wires or metal interconnections underneath.

It should further be noted that the metal interconnections such as the metal interconnection 78 and/or metal interconnection 72 are in fact the metal interconnect patterns 24 overlapping the MTJ region 22 shown in FIG. 1 and the MTJ 58 disposed on the periphery region 16 shown in FIG. 3 if viewed from the top would share same shape as the MTJ region 22. In other words, the MTJ 58 on the periphery region 16 if viewed from the top would appear as a circular ring or rectangular ring surrounding the entire array region 14. In contrast to the MTJ 58 on the periphery region 16 surrounding the entire array region 14 in a circular ring or rectangular ring, the MTJ 58 on the MRAM region 18 if viewed from the top would include a shape different from the MTJ 58 on the periphery region 16. Specifically, the MTJ 58 or MTJs 58 on the MRAM region 18 could appear as individual MTJs arranged according to an array while each of the independent MTJs 58 on the MRAM region 18 could include but not limited to for example a rectangle.

Figure 4:
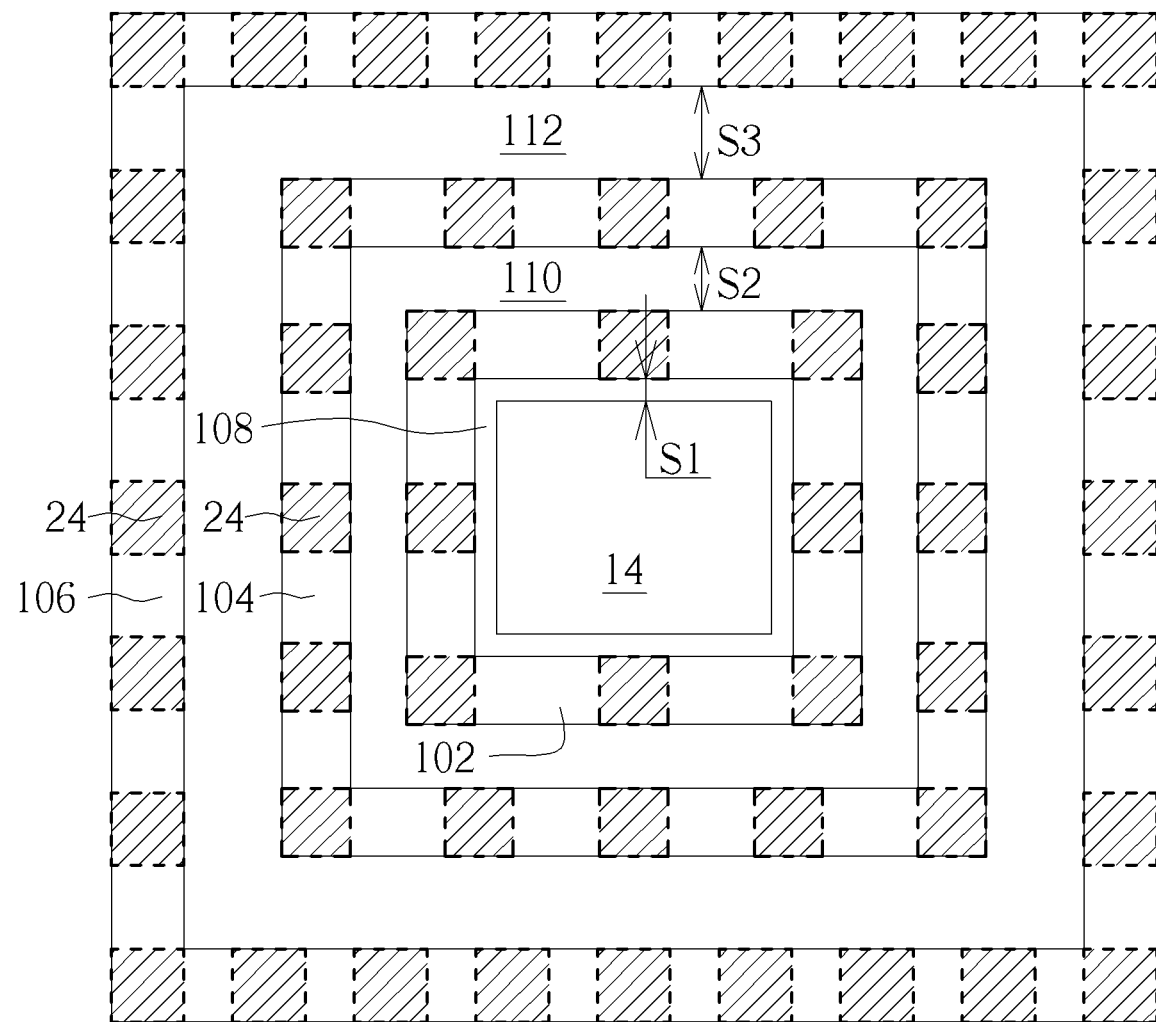
FIG. 4 illustrates a top view of a MRAM device according to an embodiment of the present invention.

Referring to FIG. 4, FIG. 4 illustrates a top view of a MRAM device according to an embodiment of the present invention. As shown in FIG. 4, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a periphery region 16 surrounding the array region 14 are defined on the substrate 12. Similar to the aforementioned embodiment, the array region 14 in this embodiment could also be referred to as a MRAM macro region and the array region 14 could further include a MRAM region and a logic region while the periphery region 16 could include MTJ regions surrounding the array region 14.

In contrast to the aforementioned embodiment of only placing a ring of MTJ region around the array region 14, at least three rings of MTJ regions are disposed around the array region 14. Preferably, a first ring of MTJ region 102 is disposed around the array region 14, a second ring of MTJ region 104 is disposed around the first ring of MTJ region 102, and a third ring of MTJ region 106 is disposed around the second ring of MTJ region 104, in which gaps are formed between the MTJ regions 102, 104, 106 and the array region 14 so that the regions do not contact each other directly. For instance, a first gap 108 is disposed between the array region 14 and the first ring of MTJ region 102, a second gap 110 is disposed between the first ring of MTJ region 102 and the second ring of MTJ region 104, and a third gap 112 is disposed between the second ring of MTJ region 104 and the third ring of MTJ region 106.

In this embodiment, the distance between the array region 14 and the MTJ region 102 is preferably different from the distance between the MTJ regions 102, 104, 106. For instance, the distance 51 (also referred to as the width of the first gap 108) between the array region 14 and the first ring of MTJ region 102 is preferably less than the distance S2 (also referred to as the width of the second gap 110) between the first ring of MTJ region 102 and the second ring of MTJ region 104, and the distance S2 between the first ring of MTJ region 102 and the second ring of MTJ region 104 is also less than the distance S3 (also referred to as the width of the third gap 112) between the second ring of MTJ region 104 and the third ring of MTJ region 106.

Similar to the aforementioned embodiment, the MRAM unit shown in FIG. 4 also includes multiple metal interconnect patterns 24 overlapping part of the MTJ regions 102, 104, 106, in which each of the metal interconnect patterns 24 preferably include a square or rectangle, and the metal interconnect patterns 24 not only overlap the MTJ regions 102, 104, 106 surrounding the array region 14 but could also choose to overlap or not overlap the four corners, which are all within the scope of the present invention.

Figure 5:
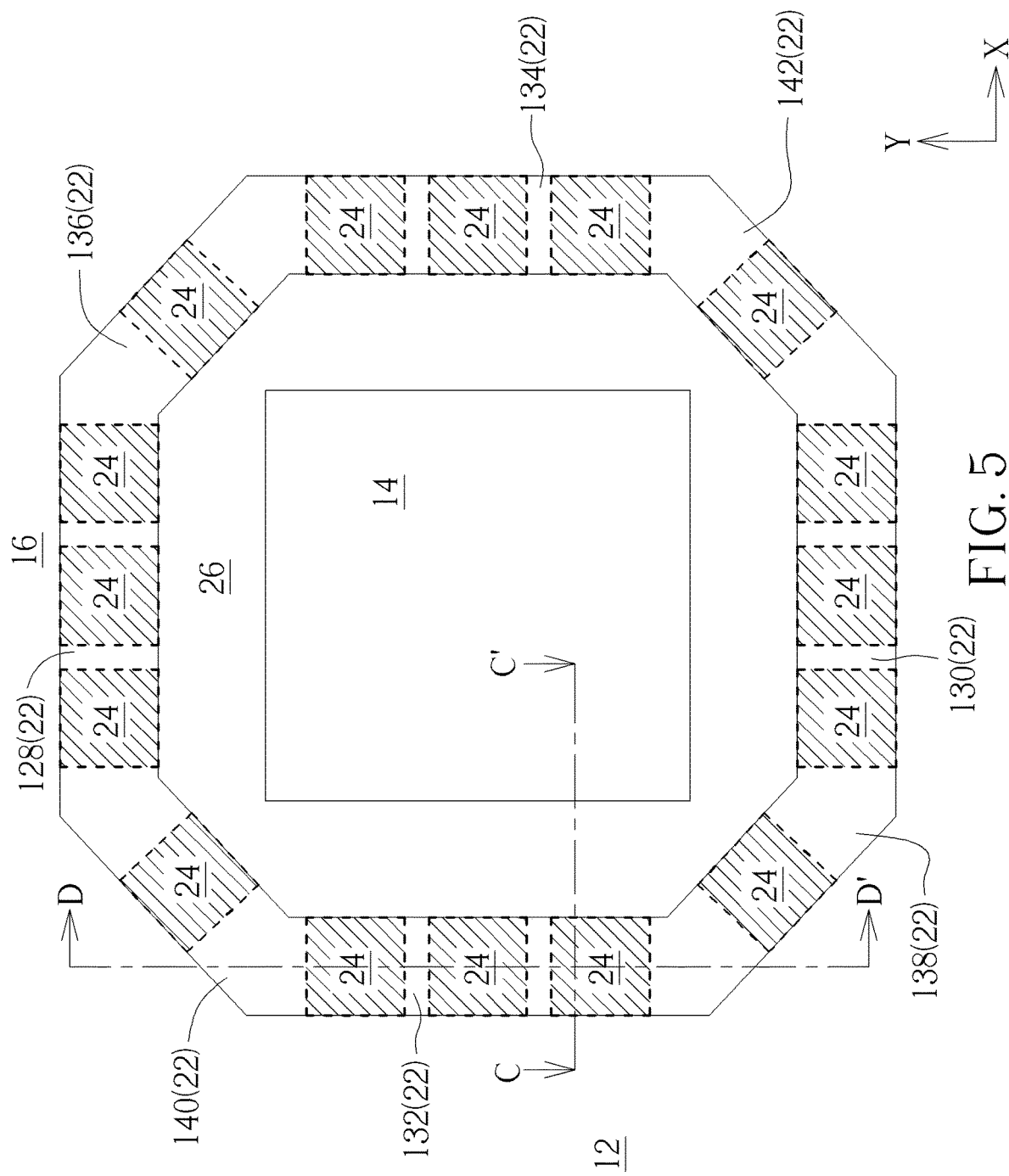
FIG. 5 illustrates a top view of a MRAM device according to an embodiment of the present invention.
Figure 6:
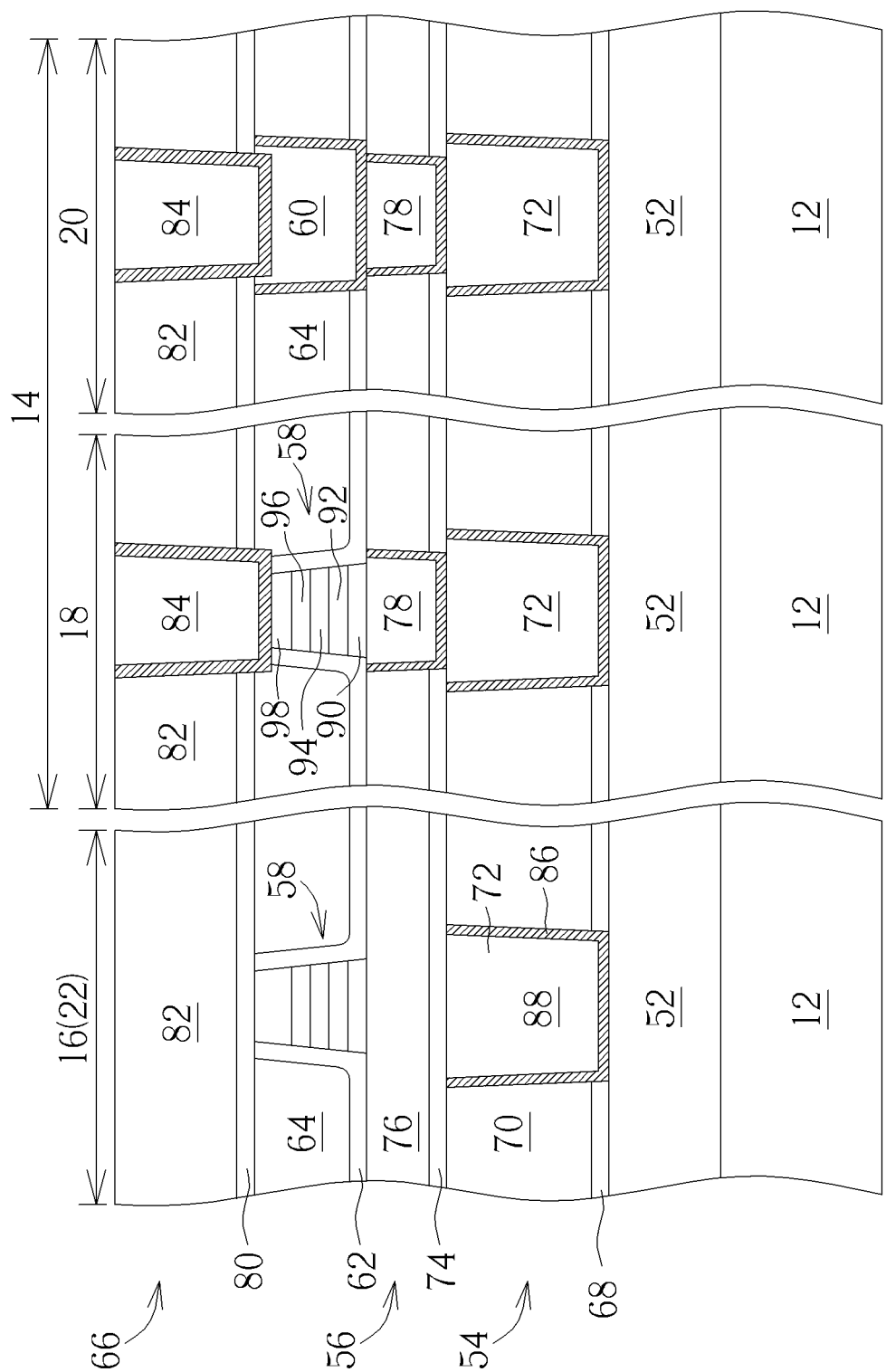
FIG. 6 illustrates a cross-section of the MRAM device along the sectional line CC' of FIG. 5.

Referring to FIGS. 2-3 and FIGS. 5-6, FIG. 5 illustrates a top view of a semiconductor device, or more specifically a MRAM device according to an embodiment of the present invention, FIGS. 2 and 6 illustrate cross-sections of the MRAM device along the sectional line CC' of FIG. 5 according to different embodiments of the present invention and FIG. 3 illustrates a cross-section of the MRAM device along the sectional line DD' of FIG. 5 according to an embodiment of the present invention. As shown in FIGS. 2-3 and 5-6, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). An array region 14 and a periphery region 16 surrounding the array region 14 are defined on the substrate 12, in which the array region 14 in this embodiment could also be referred to as a MRAM macro region. The array region 14 could further include a MRAM region 18 and a logic region 20 while the periphery region 16 could include at least a ring of MTJ region 22 surrounding the array region 14.

Viewing from a more detailed perspective, the MRAM unit shown in FIG. 1 also includes a plurality of metal interconnect patterns 24 overlapping part of the MTJ region 22 and a gap 26 disposed between the array region 14 and the ring of MTJ region 22 so that the ring of MTJ region 22 does not contact the array region 14 directly. In this embodiment, the MTJ region 22 surrounding the array region 14 further includes a first MTJ region 128 and a second MTJ region 130 extending along a first direction (such as X-direction), a third MTJ region 132 and a fourth MTJ region 134 extending along a second direction (such as Y-direction), a fifth MTJ region 136 and a sixth MTJ region 138 extending along a third direction, and a seventh MTJ region 140 and an eighth MTJ region 142 extending along a fourth direction.

Preferably, the fifth MTJ region 136 connects the first MTJ region 128 and the fourth MTJ region 134, the sixth MTJ region 138 connects the second MTJ region 130 and the third MTJ region 132, the seventh MTJ region 140 connects the first MTJ region 128 and the third MTJ region 132, and the eighth MTJ region 142 connects the second MTJ region 130 and the fourth MTJ region 134.

In other words, the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142 together constitute an octagonal shaped ring surrounding the array region 14 and the metal interconnect patterns 24 overlap each of the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142. In this embodiment, the lengths of the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142 could have different combinations. For instance, the length of each of the MTJ regions 128, 130, 132, 134, 136, 138, 140, 142 could be the same or different as long as the ring of the MTJ regions 128, 130, 132, 134, 136, 138, 140, 142 maintain an octagon.

In this embodiment, each of the metal interconnect patterns 24 includes a square or rectangle and the metal interconnect patterns 24 overlap all of the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142 surrounding the array region 14. Nevertheless, according to other embodiments of the present invention, it would also be desirable to form metal interconnect patterns 24 so that the patterns 24 only overlap some of the MTJ regions such as the first MTJ region 128, the second MTJ region 130, the third MTJ region 132, the fourth MTJ region 134 but not overlapping the fifth MTJ region 136, the sixth MTJ region 138, the seventh MTJ region 140, and the eighth MTJ region 142, which is also within the scope of the present invention.

It should be noted that despite only one metal interconnect pattern 24 is shown to overlap each of the fifth MTJ region 136, the sixth MTJ region 138, the seventh MTJ region 140, and the eighth MTJ region 142 and three metal interconnect patterns 24 are shown to overlap each of the first MTJ region 128, the second MTJ region 130, the third MTJ region 132, and the fourth MTJ region 134, according to other embodiment of the present invention, it would also be desirable to adjust the number of the metal interconnect patterns 24 overlapping the MTJ regions 128, 130, 132, 134, 136, 138, 140, 142 so that the number of metal interconnect patterns 24 overlapping the MTJ regions 128, 130, 132, 134, 136, 138, 140, 142 could be the same or different. For instance, it would be desirable to dispose only one or more than one metal interconnect patterns 24 on the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142 while the number of metal interconnect patterns 24 overlapping each of the MTJ regions 128, 130, 132, 134, 136, 138, 140, 142 could be the same or different, which are all within the scope of the present invention.

Overall, the number of metal interconnect patterns 24 overlapping the fifth MTJ region 136 is less than the number of the metal interconnect patterns 24 overlapping the first MTJ region 128 or the fourth MTJ region 134, the number of metal interconnect patterns 24 overlapping the sixth MTJ region 138 is less than the number of metal interconnect patterns 24 overlapping the second MTJ region 130 or the third MTJ region 132, the number of metal interconnect patterns 24 overlapping the fifth MTJ region 136 is equal to the number of metal interconnect patterns 24 overlapping the sixth MTJ region 138, the number of metal interconnect patterns 24 overlapping the seventh MTJ region 140 is less than the number of metal interconnect patterns 24 overlapping the first MTJ region 128 or the third MTJ region 132. the number of metal interconnect patterns 24 overlapping the eighth MTJ region 142 is less than the number of metal interconnect patterns 24 overlapping the second MTJ region 130 or the fourth MTJ region 134, and the number of metal interconnect patterns 24 overlapping the seventh MTJ region 140 is equal to the number of metal interconnect patterns 24 overlapping the eighth MTJ region 142.

Moreover, it should be noted that even though each of the metal interconnect patterns 24 in this embodiment preferably share equal size such as equal lengths and equal widths, according to an embodiment of the present invention, it would also be desirable to adjust the sizes of the metal interconnect patterns 24 so that the metal interconnect patterns 24 could have different lengths and/or different widths. For instance, the metal interconnect patterns 24 overlapping each of the first MTJ region 128, the second MTJ region 130, the third MTJ region 132, the fourth MTJ region 134, the fifth MTJ region 136, the sixth MTJ region 138, the seventh MTJ region 140, and the eighth MTJ region 142 could include same and/or different sizes, in which the definition of different size in this embodiment could refer to same lengths and different widths or same widths and different lengths, which are all within the scope of the present invention.

Referring to FIGS. 2-3 and 5, FIGS. 2-3 illustrate cross-sections of the MRAM device along the sectional line CC' and DD' of FIG. 5 according to different embodiments of the present invention. Similar to the aforementioned embodiment, the MRAM device shown in FIG. 5 if taken along the sectional line CC' could have a cross-section illustrated in FIG. 2 while the same device if taken along the sectional line DD' could have a cross-section illustrated in FIG. 3 with accompanying numberings as disclosed above.

Referring to FIG. 6, FIG. 6 illustrates a cross-section of FIG. 5 along the sectional line CC' according to an embodiment of the present invention. As shown in FIG. 6, instead of forming a metal interconnection 78 directly under and contacting the MTJ 58 on the periphery region 16, it would also be desirable to eliminate the metal interconnection 78 directly contacting the MTJ 58 underneath and/or the metal interconnection 78 directly above the MTJ 58 while keeping the metal interconnection 72 on the lower level. In this instance, the MTJ 58 on the periphery region 16 would be floating within the IMD layer 64 while the MTJ 58 on the MRAM region 18 is still connected to metal interconnections 78. Structurally, the top surface of the MTJ 58 on the periphery region 16 could be even with or higher than the top surface of the MTJ 58 on the MRAM region 18, the bottom surface of the MTJ 58 on the periphery region 16 is even with the bottom surface of the MTJ 58 on the MRAM region 18, and the top surface and/or the bottom surface of the MTJ 58 is not connected to or directly contacting any metal or conductive element. In other words, the top surface of the MTJ 58 would be contacting the stop layer 80 directly and the bottom surface of the MTJ 58 or the ring of MTJ region 22 surrounding the array region 14 on the periphery region 16 would be contacting the IMD layer 76 directly, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having an array region defined thereon;
   a ring of magnetic tunneling junction (MTJ) region surrounding the array region, wherein the ring of MTJ region comprises an octagon; and
   metal interconnect patterns overlapping part of the ring of MTJ region.

2. The semiconductor device of claim 1, further comprising a gap between the array region and the ring of MTJ region.

3. The semiconductor device of claim 2, wherein the ring of MTJ region comprises:
   a first MTJ region and a second MTJ region extending along a first direction;
   a third MTJ region and a fourth MTJ region extending along a second direction;
   a fifth MTJ region and a sixth MTJ region extending along a third direction; and
   a seventh MTJ region and an eighth MTJ region extending along a fourth direction.

4. The semiconductor device of claim 3, wherein the fifth MTJ region connects the first MTJ region and the fourth MTJ region.

5. The semiconductor device of claim 3, wherein the sixth MTJ region connects the second MTJ region and the third MTJ region.

6. The semiconductor device of claim 3, wherein the seventh MTJ region connects the first MTJ region and the third MTJ region.

7. The semiconductor device of claim 3, wherein the eighth MTJ region connects the second MTJ region and the fourth MTJ region.

8. The semiconductor device of claim 3, wherein the first direction is orthogonal to the second direction.

9. The semiconductor device of claim 3, wherein a number of the metal interconnect patterns overlapping the fifth MTJ region is less than a number of the metal interconnect patterns overlapping the first MTJ region.

10. The semiconductor device of claim 3, wherein a number of the metal interconnect patterns overlapping the sixth MTJ region is less than a number of the metal interconnect patterns overlapping the second MTJ region.

11. The semiconductor device of claim 3, wherein a number of the metal interconnect patterns overlapping the fifth MTJ region is equal to a number of the metal interconnect patterns overlapping the sixth MTJ region.

12. The semiconductor device of claim 3, wherein a number of the metal interconnect patterns overlapping the seventh MTJ region is less than a number of the metal interconnect patterns overlapping the first MTJ region.

13. The semiconductor device of claim 3, wherein a number of the metal interconnect patterns overlapping the eighth MTJ region is less than a number of the metal interconnect patterns overlapping the second MTJ region.

14. The semiconductor device of claim 3, wherein a number of the metal interconnect patterns overlapping the seventh MTJ region is equal to a number of the metal interconnect patterns overlapping the eighth MTJ region.

15. The semiconductor device of claim 1, wherein each of the metal interconnect patterns comprises a square or rectangle.

16. A semiconductor device, comprising:
    a substrate having an array region and a periphery region;
    a first magnetic tunneling junction (MTJ) on the array region; and
    a second MTJ on the periphery region, wherein a bottom surface of the second MTJ contacts a dielectric layer directly.

17. The semiconductor device of claim 16, wherein bottom surfaces of the first MTJ and the second MTJ are coplanar.

18. The semiconductor device of claim 16, wherein a top surface of the first MTJ is lower than a top surface of the second MTJ.

19. The semiconductor device of claim 16, further comprising a metal interconnection under the first MTJ, wherein the dielectric layer surrounds the metal interconnection.

20. The semiconductor device of claim 16, further comprising a cap layer on sidewalls of the second MTJ.

* * * * *